United States Patent [19]
Liu

[11] Patent Number: 5,317,218
[45] Date of Patent: May 31, 1994

[54] CURRENT SENSE CIRCUIT WITH FAST RESPONSE

[75] Inventor: Ding-Jen Liu, Hsinchu, Taiwan

[73] Assignee: United Microelectronics Corp., Taiwan, Taiwan

[21] Appl. No.: 46,665

[22] Filed: Apr. 12, 1993

Related U.S. Application Data

[63] Continuation-in-part of Ser. No. 869,234, Apr. 15, 1992, abandoned, which is a continuation-in-part of Ser. No. 637,475, Jan. 4, 1991, abandoned.

[51] Int. Cl.[5] .......................................... G01R 19/00
[52] U.S. Cl. .................................... 307/530; 307/242; 307/360; 307/263; 365/185
[58] Field of Search ............... 307/242, 243, 350, 359, 307/360, 443, 530, 572, 362, 263; 365/49, 185

[56] References Cited

U.S. PATENT DOCUMENTS

| | | | |
|---|---|---|---|
| 4,152,595 | 5/1979 | Garfinkel et al. | 307/350 |
| 4,527,076 | 7/1985 | Matsuo et al. | 307/362 |
| 4,602,169 | 7/1986 | Shimizu | 307/359 |
| 4,609,832 | 9/1986 | Mehl | 307/243 |
| 4,763,023 | 8/1988 | Spence | 307/362 |
| 4,866,301 | 9/1989 | Smith | 307/350 |
| 4,931,844 | 6/1990 | Zommer | 307/242 |
| 4,999,521 | 3/1991 | Ruszhyak | 307/359 |
| 5,047,657 | 9/1991 | Seevinck et al. | 307/359 |

Primary Examiner—William L. Sikes
Assistant Examiner—Terry D. Cunningham
Attorney, Agent, or Firm—Poms, Smith, Lande & Rose

[57] ABSTRACT

A current sense circuit with fast response for sensing a current input from a current source such as a memory cell, comprising a first amplifying means and a second amplifying means coupled to a first transistor and a second transistor, respectively. The first transistor is smaller in size than the second transistor and the reference voltage of the first amplifying means is slightly larger than the reference voltage of the second amplifying means. A load is coupled to the drain of the first transistor.

9 Claims, 4 Drawing Sheets

CURRENT SENSE CIRCUIT WITH FAST RESPONSE

CROSS-REFERENCES AND RELATED APPLICATION

This is a continuation-in-part of application Ser. No. 07/869,234 filed on Apr. 15, 1992 and now abandoned, which is in turn a continuation-in-part of application Ser. No. 07/637,475, filed on Jan. 4, 1991 and now abandoned.

BACKGROUND OF THE INVENTION

The present invention relates to a current sense circuit for sensing memory devices, and more particularly, to a circuit suitable for fast response operations of large signals.

The current sense circuit is as well known, good for sensing small currents from signal sources which have large inherent capacitances. This is because the current sense circuit has a low input impedance and can provide a constant voltage for the signal source. By means of providing a constant voltage across the inherent capacitance of the signal source, it can avoid current being contributed by the capacitance so that the true signal current can be picked up by the sense circuit.

One of the conventional current sense circuits is as shown in FIG. 6 which comprises a current source type input to the sense circuit at 14', an impedance transfer circuit 17' composed of a sense transistor M1 and an inverting amplifier A1, a load 21' connected between the drain of the transistor M1 and a positive supply terminal Vcc and a two-stage comparator 23'. The output 19' of the impedance transfer circuit 17' is coupled to the inverting terminal of the two-stage comparator 23' so as to be compared with a first reference voltage 22' which inputs from a non-inverting terminal of the comparator 23'.

The current source input 14' is coupled to an inverting terminal of the amplifier A1 and a second reference voltage 18' is input to the amplifier A1 from a non-inverting terminal thereof. The transistor M1 is served as a source follower. The output of the amplifier A1 is connected to a gate of the transistor M1 and there is a negative feedback loop between the amplifier and the transistor so that at the point 15', there is a very low input impedance and a constant terminal voltage, which approximately equals the second reference voltage 18' that is provided. In a real circuit, the amplifier A1 may be an amplifier with a single input terminal. In this case, the reference voltage 18' is deemed as a virtual reference voltage.

The impedance transfer circuit 17' has a high impedance output on the point 19' and the current at the point 19' equals the current flowing to the current source input 14'. Therefore, by measuring the current at the point 19', it is possible to measure the current of the current source 14'. The comparator 23' then compares the current level (or voltage level output Vout) and the first reference current level (or the first reference voltage level 22') to provide a logic level output 24' for the sense circuit.

However, when the prior sense circuit is applied to sense the current of the memory devices, several problems occur. In such case, the current source 14' is a memory cell and the sense circuit will be influenced not only by the small signal response, but also by the large signal response. Such a prior sense circuit is normally connected to the memory cell via bit line multiplexers and bit lines and the selected bit lines should undergo voltage level transition caused by the action of an address decoder. In the transition period, the current sense circuit of FIG. 6 can pick up combinations of signals, especially the current contribution of the inherent capacitance of the signal source, rather than the true signal current. In this case, the inherent capacitance of the signal source is a parasitic capacitance of the bit line and the current picked up by the sense circuit is mostly the charge current for the parasitic capacitance, which is much larger than the true signal current which the circuit intends to detect.

To explain the disadvantages of the prior art, the following discloses a conventional read only memory cell array and multiplexer in accompanied with FIG. 5.

As shown in FIG. 5, the memory cell array includes word lines 5, bit lines 6 and a number of cell transistors such as those 1, 2, 3 and 4. The multiplex includes X multiplexers 7, 8 and Y multiplexers 9, 10, 11 and 12. The arrow numbered by 14 in FIG. 5 connects to the current source 14' in FIG. 6 (14" in FIGS. 8 and 14 in FIG. 1) representing that the output of the memory cell are input into the current sense circuit. Each of the cell transistors represent some bit of data. Take the cell transistor 3 as an example, if the transistor 3 is a normal transistor, the bit is 1 and if the transistor is an always-off transistor (e.g. by means of being programmed by boron implantation), the bit is 0. To access the bit represented by the transistor 3, XA 7 is set to low, XB 8 is set to high; WO2 5 is set to high, other word lines 5 except WO2 are set to low; YM1 is set to high, YG1 is set to high, and YG2 is set to low. In this way, BL2 (a second bit line) and source/drain diffusions S2B and S3A are switched to the terminal 14; BL3 (a third bit line) and source/drain diffusion S3B are switched to ground; BL1 (a first bit line) and source/drain diffusion S2A are switched to the terminal 13.

In order to determine whether the transistor 3 is a normal transistor or an always-off transistor, the sense circuit provides a bit line voltage of 1.5 V to the bit line, hence a voltage of 1.5 V shall be applied to the transistor at S3A. At this time, S3B is connected to the ground. If the transistor 3 is a normal transistor, it will be turned on and a current will flow therefrom. If the transistor 3 is an always-off transistor, then no current will be flowing from the transistor 3. Accordingly, the sense circuit is used to detect and quantize the current level into logic 1 or 0. In the case of the above, since BL1 and S2A are driven to 1.5 V via the terminal 13, no current will pass through the transistor 1, that is, only the transistor 3 is tested.

The equivalent circuit or the memory cell which connects to a normal transistor is as shown in FIG. 7 which comprises a cell current source Ic and a stray capacitance $C_O$ and a resistance $R_O$ respectively connected in parallel with the cell current source Ic. If the memory cell is connected to an always-off transistor cell, the equivalent circuit of the memory cell can be obtained by removing the elements $R_O$ and $I_c$ from FIG. 7, which means that the equivalent circuit thereof is equivalent to the bit line stray capacitance $C_O$. For fast detection, the voltage of selected bit line has to be increased to a higher potential of about 1.5 V from ground potential. When an always-off transistor is used, the charge of the bit line capacitance will dominate the current being picked up by the sense amplifier, such that the correct data is unavailable. Moreover, in order to achieve faster access time for the memory chip, the transition time of the bit line should be as short as possible. However, due to the presence of the load 21' as shown in FIG. 6, the access time is limited. As a result, the sense circuit in FIG. 6 is not suitable for fast operation with bit line voltage transition.

Another prior art of the sense circuits which is intended to solve the problem of the load by restricting the response of the large signals (i.e., the voltage of the bit line range from 0 to 1.5 V) is as shown in FIG. 8. To help to explain the operation of the sense circuit of FIG. 8, the same elements as those shown in FIG. 6 are referenced by the same numbers. As shown in the figure, the circuit further comprises a second transistor M2 disposed between the inverting amplifier A1 and the transistor M1. Further, a Miller's capacitance $C_m$ is connected between a gate of the second transistor M2 and a drain of the first transistor and a stray capacitance $C_L$ is connected between the drain of the first transistor M1 and a ground. The source of the transistor M2 is connected to the connecting point of the source of the transistor M1 and the current source 14" for speeding up the response of the large signals. In the case of detecting small signals, part of the current from the current source 14" bypasses through the transistor M2 such that the current I1 in FIG. 8 is smaller than that in FIG. 6. When the current I1 becomes smaller, the voltage drop across the load 21" decreases, thereby limiting the voltage martin of the sense circuit. During operation, current I1 and current I1 are switched on simultaneously and the current I2 is large than I1, so that if the load 21" does not become larger, the sense margin will become smaller. By increasing the impedance of the load 21", the sensing margin will be retained, it will cause the following disadvantages:

(1) The higher the impedance of the load 21" is the larger the voltage gain from terminal 14" to the output terminal 19" becomes, the noise immunity becomes poorer, which results in an unstable operation point of the transistor M1; and (2) The higher the impedance of the load 21" is, the smaller the current I1 through the load becomes, thus inevitably causing the small signal response to slow down.

The current through the transistor M2 can be compensated by enlarging the size of the transistor M2, but the larger the transistor M1 is, the larger the Miller's capacitance $C_m$ becomes, and hence the stray capacitance $C_L$ will be, which further degrades the response speed of the small signals.

SUMMARY OF THE INVENTION

Therefore, the object of the present invention is to provide a current sense circuit which is capable of a fast response for large signals, with safe sense amplifier margin, as well as fast slew rate and, hence, excellent access time, whereby reliable read operations can be achieved for memory chips.

Further objects and advantages of the present invention will become apparent as the following description proceeds, and the feature of novelty which characterizes the invention is pointed out, particularly in the appended claims annexed to and forming a part of the invention.

DETAILED DESCRIPTION OF THE INVENTION

Figure 1:
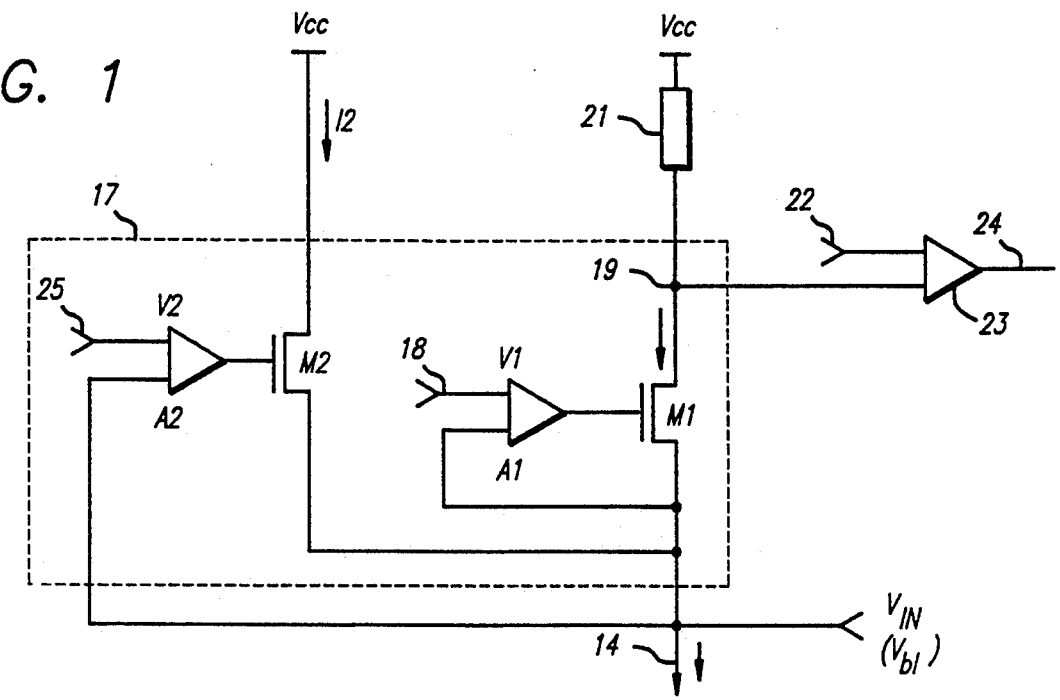
FIG. 1 shows a circuit diagram of the current sense circuit with a fast response, according to the present invention.
Figure 6:
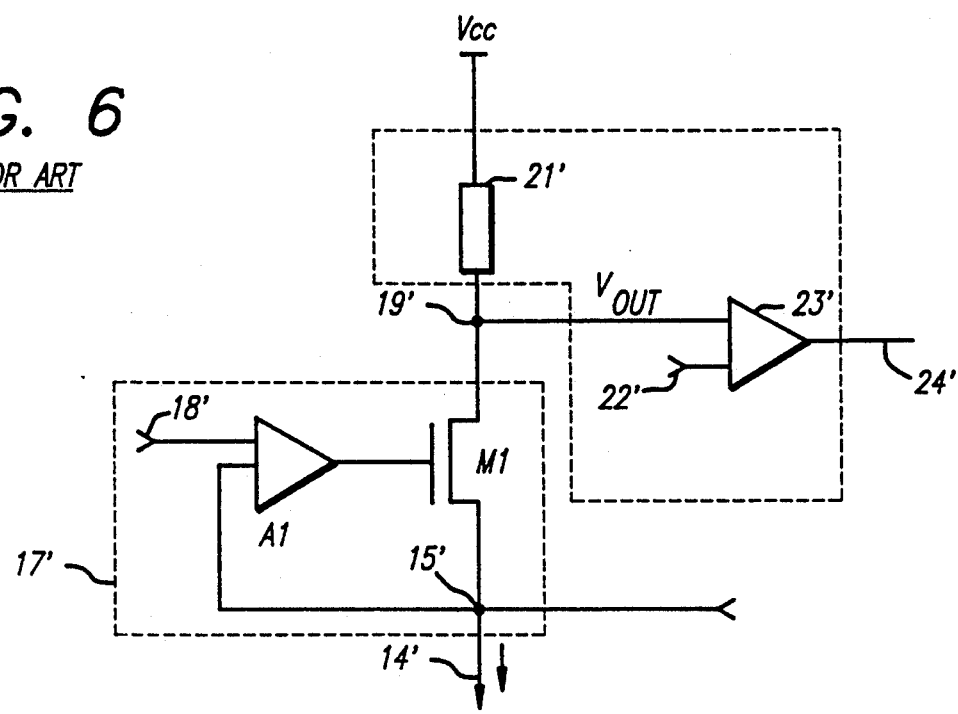
FIG. 6 shows a schematic diagram of a first conventional current sense circuit.
Figure 7:
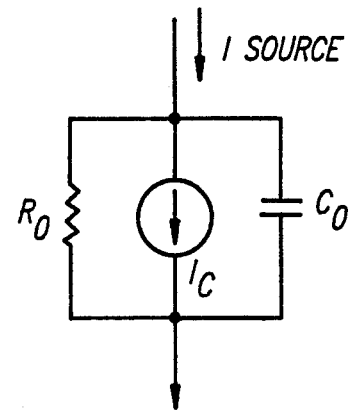
FIG. 7 shows an equivalent circuit of a memory cell which connected to a normal transistor.
Figure 8:
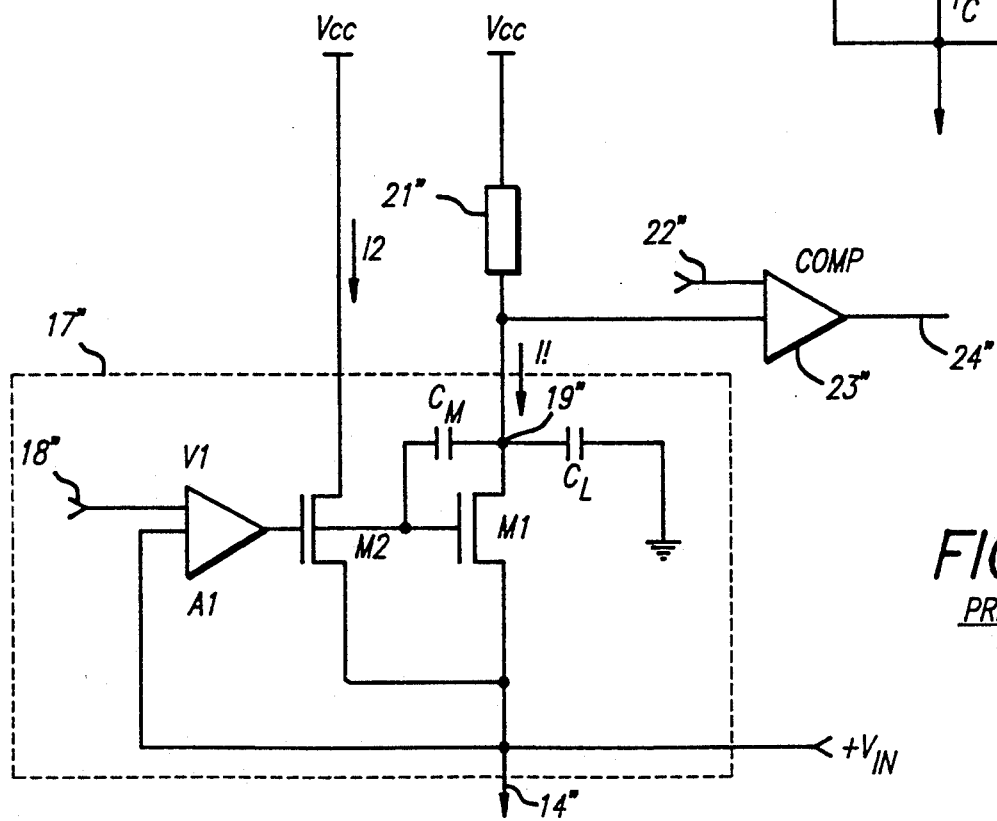
FIG. 8 shows a schematic diagram of a second conventional current sense circuit.

As shown in FIG. 1, the present invention is intended to solve the above problems of the conventional current sensors by using an impedance transfer circuit 17 which comprises a first inverting amplifier A1 and a second inverting amplifier A2 for controlling a first and a second transistors M1 and M2 respectively. The impedance circuit 17 of the present invention also has a current source type input at 14 and a high impedance output at 19. The transistor M1 is small in size as required for the response of small signals and the transistor M2 is larger for fast response of the large signals. The current sense circuit of the present invention further comprises a load 21 which has an impedance in nature. In an alternative embodiment load 21 can be replaced by an NMOS or PMOS circuit, of which the impedance may be larger than that of the load 21' in FIG. 6. In addition, the amplifier A1 has a first reference voltage 18 of about 1.5 V inputting to a non-inverting terminal thereof, by which the stable voltage of the bit line is determined in the same manner as that mentioned in connection with FIG. 6 above. The amplifier A2 has a second reference voltage 25 inputting to a non-inverting terminal thereof, which is slightly lower than the first reference voltage 18.

Figure 5:
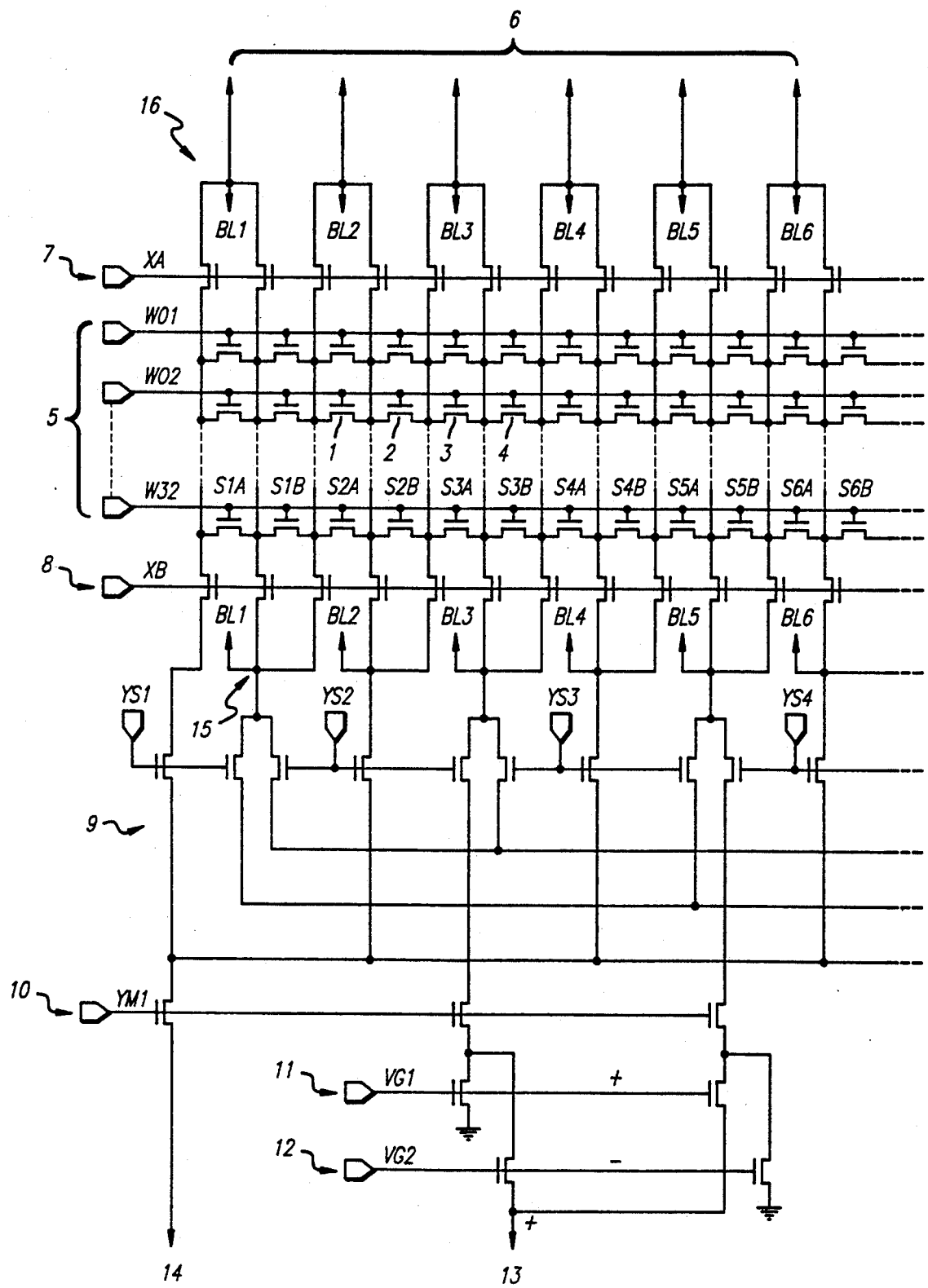
FIG. 5 shows a schematic diagram illustrating a read only memory cell array and multiplexer.

As mentioned above, when applied in sensing the current of a memory cell of the type in FIG. 5, the current source type input 14 of the impedance transfer circuit 17 illustrated in FIG. 1 is connected to the line numbered 14 in FIG. 5 so that the current source being sensed by the impedance transfer for circuit 17 is deemed as a memory cell. When a memory access causes a predetermined selected bit line (i.e., a selected memory cell) to be switched to a new bit line, the new bit line must be charged to about 1.5 V to test the new selected cell. In the transition from 0 V to about 1.4 V, both the transistors M1 and M2 will supply currents to charge the selected bit line. Since M2 has a larger size than the transistor M1, and in the current path of the transistor M2 no load devices exist as the load 21 in the current path of the first transistor M1, most of the current is supplied by the transistor M2. After the bit line is charged to about 1.4 V, the transistor M2 will be turned off by the amplifier A2 since the reference voltage 25 of the amplifier A2 is lower than that of the amplifier A1. When the transistor M2 is turned off, the transistor M1 will continue operation such that the impedance transfer circuit 17 works in a small signal mode.

In the small signal mode operation, the voltage on the selected bit line will be very close to 1.5 V, so as to cause the amplifier A2 to provide a gate voltage at M2 which is much lower than the threshold voltage thereof. At that time, the transistor M2 will remain in the off stage until the next memory access occurs. Therefore, simply by designing the reference voltage of the amplifier A2 lower than that of the amplifier A1, the transistor M2 will automatically turn off every time its job is done, without the need of an external clock. Accordingly, the sense amplifier of the present invention can detect correct current of the memory cell in a very short time after the transistor M2 is turned off. The impedance transfer circuit 17 of the present invention illustrated in FIG. 1 also has a high impedance output at 19 similar to the above discussion of the sense circuit illustrated in FIG. 6. In small signal mode operation, measurement of the current flow at the high impedance output 19 provides a measure of the current flow at the current source type input 14. Instead of measuring current, however, a voltage drop across load 21 may also be used to obtain a measure of the current flow at input 14. A comparator 23 may also be included to provide a logic level type output at 24 through a comparison of the current, or voltage, level at the output 19 of the impedance transfer circuit 17 with respect to a reference current or voltage level connected to a second input 22 of the comparator 23.

Figure 2:
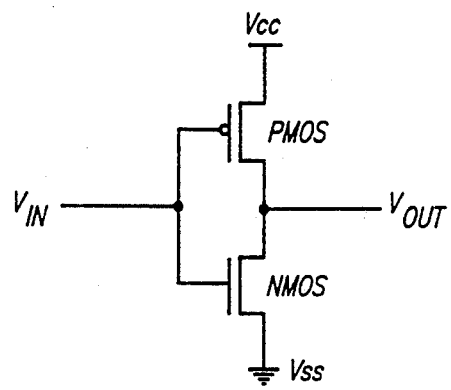
FIG. 2 shows a circuitry diagram of an inverter used in a second embodiment for the inverting amplifiers of FIG. 1 formed of a NMOS transistor and a PMOS transistor; the inherent voltage thereof can be deemed as a reference voltage.
Figure 3:
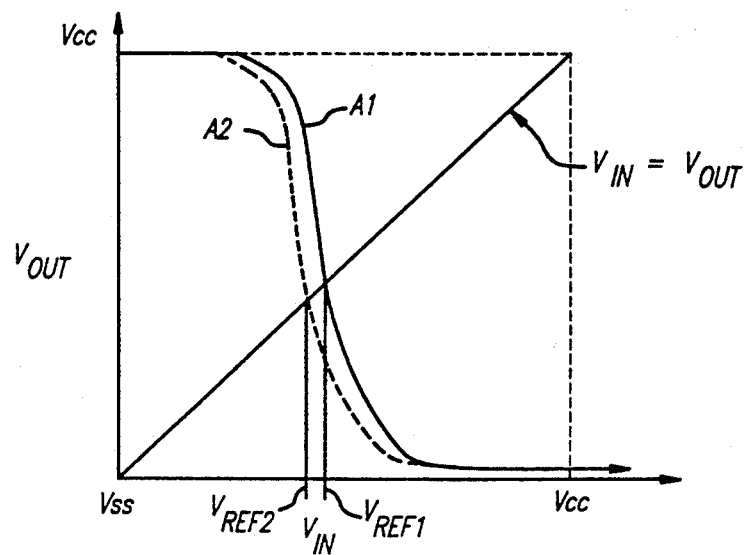
FIG. 3 is a Vin-Vout transfer curve of the amplifying means of FIG. 2.

As discussed above, in an alternative embodiment at the present invention the amplifiers A1 and A2 can be replaced by the inverting amplifying means illustrated in FIG. 2. The circuit of FIG. 2 is composed of a PMOS transistor and a NMOS transistor and the Vout—Vin curve thereof is as shown in FIG. 3. When the respective voltages across the PMOS and NMOS transistors are equal, the output voltage will be the same as the input voltage. The inverting amplifying means of FIG. 2 thus has an inherent voltage which may be used as a reference voltage. When the input voltage varies, the voltage of the respective PMOS and NMOS transistors will very according to the reference voltage of the circuit so as to obtain a balanced condition. As shown in FIG. 3, the output voltage will vary in reverse proportion to the input voltage. Therefore, the means of FIG. 2 can be deemed as an inverting amplifier with a virtual (inherent) reference voltage. The transfer curve and reference voltage can be controlled by varying the width/length ration of the PMOS and the NMOS transistors shown in FIG. 2.

Figure 4:
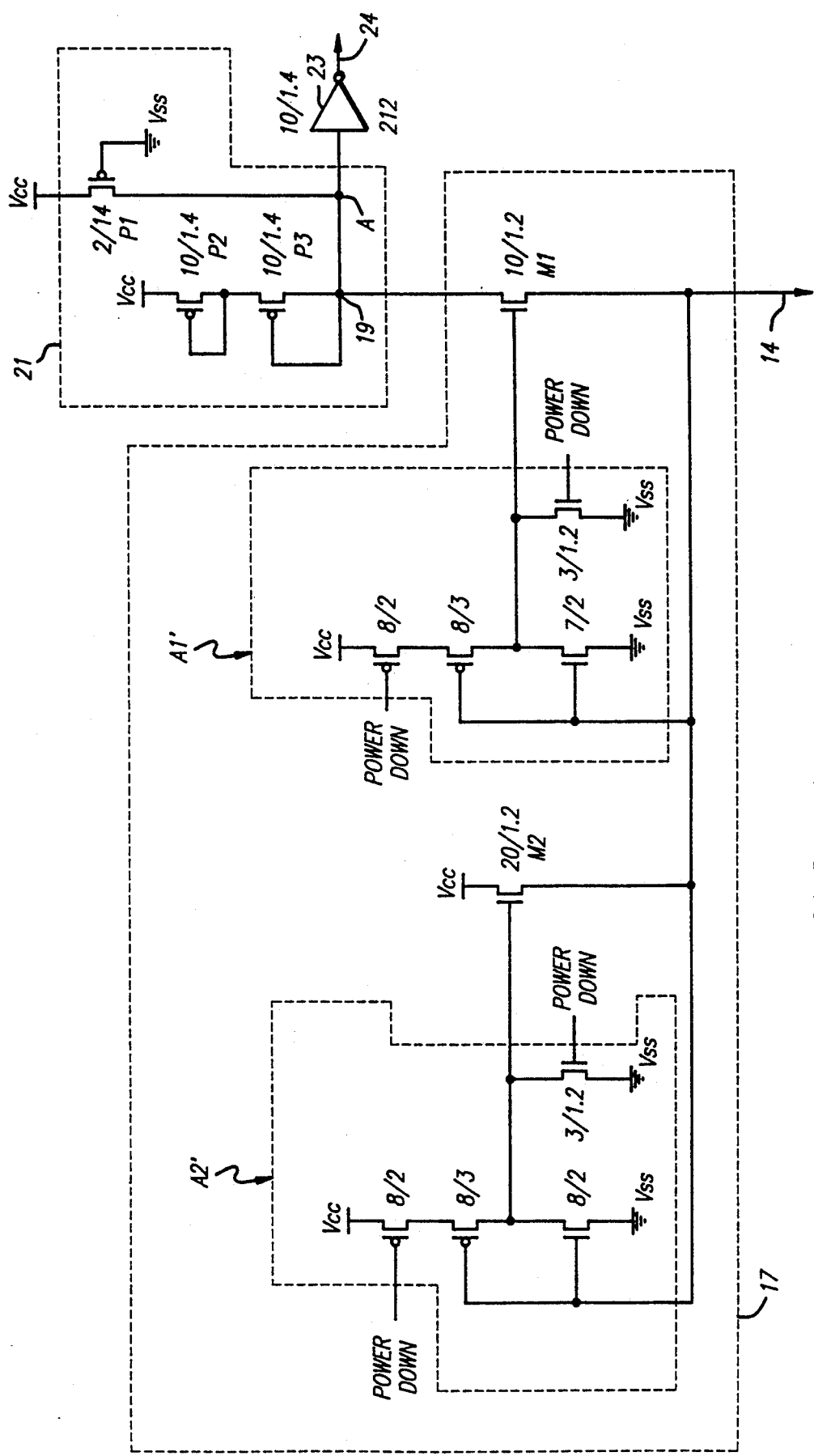
FIG. 4 shows another embodiment of the current sense circuit with a fast response, in accordance with the present invention.

FIG. 4 shows an alternative embodiment of the present invention wherein the amplifiers A1 and A2 in FIG. 1 are replaced by the inverting amplifying means of FIG. 2 respectively with the load 21 in FIG. 1 is replaced by a CMOS NOR type gate arrangement. The amplifying circuits A1' and A2' of FIG. 4 further respectively connects to two power down elements. The circuit illustrated in FIG. 4 again has a current source type input at 14 and a high impedance output at 19 like the circuit illustrated in FIG. 1. Also, similar to the circuit illustrated in FIG. 1, the input 14 of the sense circuit illustrated in FIG. 4 may be connected to the line numbered 14 in FIG. 5 so that the current source being sensed by the circuit illustrated in FIG. 4 may be deemed a memory cell.

The symbols 8/2, 3/1.2 and 7/2 in FIG. 4 represent the width/length ratio of the NMOS or PMOS transistors for the amplifying means A1' and A2' of FIG. 4, i.e., in the example of 8/2, the width of the NMOS or PMOS is eight microns and the length thereof is two microns. Since the amplifying means A2' comprises an 8/2 NMOS and the amplifying means A1' comprises a 7/2 NMOS, the reference voltage of the amplifying means A2' will be lower than that of the amplifying means A1'. The current sense circuit illustrated in FIG. 4 operates in essentially the same manner as the sense circuit illustrated in FIG. 1, except that the separate first and second reference voltages 18 and 25 required of the sense circuit illustrated in FIG. 1 are no longer required in the sense circuit illustrated in FIG. 4, in view of the inherent reference voltages of the amplifying means A1' and A2'. Thus, when a memory access causes a predetermined selected bit line (i.e., a selected memory cell) to be switched to a new bit line so that the new bit line must be charged to about 1.5 V to test the new selected memory cell, both transistors M1 and M2 in FIG. 4 will supply current to charge the new selected bit line. When the newly selected bit line is almost fully charged the transistor M2 turns off and transistor M1 remains on such that the sense circuit illustrated in FIG. 4 then works in small signal mode.

Like the sense circuit illustrated in FIG. 1, the sense circuit illustrated in FIG. 4 has a high impedance output at 19. This output 19 may be coupled to a load 21 as illustrated in FIG. 1 to provide a meausure of the small signal current flow at input 14 as discussed above in connection with FIG. 1. That is, by measurement of a voltage drop across load 21. A comparator 23 as illustrated in FIG. 1 may also be included to provide a logic level type output at 24 in FIG. 4 as also discussed above in connection with the sense circuit shown in FIG. 1.

As further mentioned above, however, in another embodiment of the present invention the load 21 illustrated in FIG. 1 may be replaced by a CMOS NOR gate type arrangement that is illustrated in FIG. 4 at 21. As shown, this gate arrangement includes transistors P2 and P3 serially connected between the voltage level $V_{cc}$ and the output 19, along with another transistor P1 effectively connected in parallel with P2 and P3 between $V_{cc}$ and a point A that is directly connected to the output 19. The gate of P1 is tied to a reference volt ground voltage $V_{ss}$ while the gate of P3 is tied to output 19 and the gate of P2 is tied to the serial connection between P2 and P3 at 30. An invertor 23 may further be connected to point A. In operation, when no current is flowing through input 14 and M1 is off, P1 will raise the voltage at A. Since the gate of P3 is connected to output 19 and effectively connected to A, P3 will be high off when M1 is off and the gate of P2 will be effectively isolated from A. Thus A will be high and the logic level output from the invertor 23 will be low. When M1 and M2 are on, the voltage at 19 and A will drop, causing P2 and P3 to turn on and provide a second current path to M1 through 19. In steady state small signal mode operation, with M2 off and M1 on, the respective length to width ratios of P2 and P3 compared to that of P1 may be selected so that P2 and P3 turn off before M1 turns off, causing the voltage level at 19 and A to drop so that the logic level output from invertor 23 will be high. The CMOS NOR gate type arrangement illustrated in FIG. 4 overcomes the reduced response time and higher noise sensitivity problems associated with a high impedance type load 21 that was discussed above, at the cost of a slightly reduced internal voltage margin.

From the foregoing, it can be seen that the transistor M2 can be designed to be sufficiently large in size to provide large, fast signal responses, without reducing the time of the small signal sensing or noise margin, thereby achieving significant improvements in access time and robustness of operation of the memory chip. Thus, there has been disclosed an improved current sense circuit providing large and fast signal responses without reducing noise immunity or small signal response time. It will, of course, be understood that modifications to the above-described current sense circuit will be apparent to others skilled in the art. Accordingly, the scope of the present invention is not limited by the particular embodiments or the descriptions above, but is defined only by the claims set forth below and to the equivalents thereof.

I claim:

1. A current sense amplifier comprising:
An impedance transfer circuit including an input terminal, a first transistor, a first amplifier, a second transistor and a second amplifier, wherein a source of said first transistor, an input of said first amplifier, a source of said second transistor and an input of said second amplifier are connected to said input terminal respectively, an output of said first amplifier is connected to a gate of said first transistor, an output of said second amplifier is connected to a gate of said second transistor and a drain of said second transistor is connected to a positive supply terminal; said first and second amplifiers respectively receiving a first and second reference voltage with the first reference voltage of said first amplifiers being larger than the second reference voltage of said second amplifier; and
a current comparator circuit, comprising a load which is connected to a drain of said first transistor and a comparator providing an output logic level of said current comparator circuit, according to a current passing through said first transistor.

2. A current sense circuit comprising: (a) an impedance transfer circuit comprising a first and a second amplifying means and a first and a second transistors having a gate, a drain and a source, respectively; wherein
said first and second amplifying means have a respective input terminal connected with a current source and receives first and second reference voltages, respectively for being compared with a voltage provided from said current source; the outputs of said first and second amplifying means are coupled respectively to the gates of said first and second transistor;
the sources of said first and second transistor both connected with said current source and the drain of said second transistor is connected directly with a positive power supply terminal, which the drain of said first transistor is connected with said positive power supply terminal via a load; and
said first transistor is smaller in size than said second transistor and said first reference voltage is slightly larger than said second reference voltage; and
(b) a current comparator means for comparing a current passing through said first transistor with a third reference voltage.

3. A current sense circuit comprising:
a current input;
a circuit output;
a first transistor having a first end connected to said current input and a second end connected to said circuit output;
an impedance load connected between a first reference voltage and said circuit output;
a second transistor having a first end connected to said current input and a second end connected to said first reference voltage;
a first amplifier having an output connected to a gate of said first transistor, a first amplifier input connected to said current input and a second amplifier input connected to a second reference voltage; and
a second amplifier having an output connected to a gate of said second transistor, a first amplifier input connected to said current input and a second amplifier input connected to a third reference voltage less than said second reference voltage, wherein measurement of a voltage drop at the circuit output is indicative of a current flow through said current input.

4. The current sense circuit of claim 3 further comprising a comparator having one input connected to said circuit output and a second input connected to a fourth reference voltage, wherein an output of the comparator provides a logic output for the current sense circuit that is one of a logic high and a logic low signal.

5. A current sensing circuit, comprising:
a circuit input;
a circuit output;
a first transistor having one end connected to said circuit input and one end connected to said circuit output;
an impedance load connected between a first reference voltage and said circuit output;
a first CMOS pair serially connected between said first reference voltage and a ground reference voltage, with both gates of said CMOS pair connected to said circuit input and with a serial interconnection between elements of said first CMOS pair connected to a gate of said first transistor;
a second transistor having one end connected to said first reference voltage and a second end connected to said circuit input; and
a second CMOS pair serially connected between said first reference voltage and said ground reference voltage with both gates of said second CMOS pair connected to said circuit input and with a serial interconnection between elements of said second CMOS pair connected to a gate of said of second transistor, wherein a voltage drop across said impedance load is indicative of a current flow through said circuit input.

6. The current sensing circuit of claim 5 wherein length to width ratios of said first and second CMOS pairs differ by an amount that causes said second transistor to be turned off by said second CMOS pair at a first voltage of said circuit input that is less than a second voltage of said circuit input at which said first transistor is turned off by said first CMOS pair.

7. The current sensing circuit of claim 5 wherein said impedance load is a first FET connected between said first reference voltage and said circuit output, with a gate connected to said ground reference voltage.

8. The current sensing circuit of claim 7 further comprising second and third FET's serially connected between said first reference voltage and said circuit output, with said second FET having its gate connected to a serial interconnection between said second and third FET's and with said third FET having its gate connected to said circuit output.

9. The current sensing circuit of claim 5 further comprising an invertor connected to said circuit output.

* * * * *